(12) United States Patent
Chen

(10) Patent No.: US 9,608,624 B2
(45) Date of Patent: Mar. 28, 2017

(54) APPARATUS FOR PERFORMING SIGNAL DRIVING WITH AID OF METAL OXIDE SEMICONDUCTOR FIELD EFFECT TRANSISTOR

(71) Applicant: MEDIATEK INC., Hsin-Chu (TW)

(72) Inventor: Shang-Pin Chen, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 208 days.

(21) Appl. No.: 14/549,552

(22) Filed: Nov. 21, 2014

(65) Prior Publication Data

US 2015/0256173 A1 Sep. 10, 2015

Related U.S. Application Data

(60) Provisional application No. 61/948,566, filed on Mar. 6, 2014.

(51) Int. Cl.
*H03K 3/00* (2006.01)
*H03K 17/687* (2006.01)
*H03K 19/0948* (2006.01)

(52) U.S. Cl.
CPC ....... *H03K 17/687* (2013.01); *H03K 19/0948* (2013.01)

(58) Field of Classification Search
CPC .......................... H03K 19/0948; H03K 17/687
USPC ...................................................... 327/108
See application file for complete search history.

(56) References Cited

U.S. PATENT DOCUMENTS

| | | | | |
|---|---|---|---|---|
| 6,057,729 A * | 5/2000 | Nomura | ................. | G06F 1/305 |
| | | | | 257/E27.046 |
| 7,852,145 B2 * | 12/2010 | Uematsu | .................. | G06F 1/26 |
| | | | | 327/545 |
| 8,111,224 B2 * | 2/2012 | Park | ..................... | G09G 3/3233 |
| | | | | 345/83 |
| 8,943,333 B2 * | 1/2015 | Kawasaki | ................ | H03J 3/20 |
| | | | | 713/300 |
| 2005/0270886 A1 * | 12/2005 | Takashima | ............. | G11C 11/22 |
| | | | | 365/232 |
| 2008/0024162 A1 * | 1/2008 | Rathi | ................. | H03K 19/0005 |
| | | | | 326/30 |

(Continued)

*Primary Examiner* — Ryan Jager
(74) *Attorney, Agent, or Firm* — Winston Hsu; Scott Margo

(57) ABSTRACT

An apparatus for performing signal driving with aid of MOSFET and an associated IC are provided, where the apparatus includes a PMOSFET coupled between a predetermined voltage level and a terminal, and further includes an NMOSFET coupled between the predetermined voltage level and the terminal. The PMOSFET is arranged for selectively driving a signal that passes through the terminal. In addition, the NMOSFET is arranged for selectively driving the signal. Additionally, the apparatus further includes another NMOSFET coupled between another predetermined voltage level and the terminal, wherein the other NMOSFET is arranged for selectively driving the signal. More particularly, the PMOSFET, the NMOSFET, and the other NMOSFET does not drive the signal at the same time. For example, each of the PMOSFET, the NMOSFET, and the other NMOSFET selectively drives the signal to have one of a plurality of logical states.

19 Claims, 10 Drawing Sheets

(56) References Cited

U.S. PATENT DOCUMENTS

| | | | | |
|---|---|---|---|---|
| 2008/0068869 A1* | 3/2008 | Shimizu | ............... | H02M 3/1582 |
| | | | | 363/25 |
| 2010/0079167 A1* | 4/2010 | Thomsen | ........... | H03K 17/6874 |
| | | | | 326/83 |
| 2010/0110767 A1* | 5/2010 | Katoh | ...................... | G11C 8/08 |
| | | | | 365/148 |
| 2011/0267112 A1* | 11/2011 | Lee | ................ | H03K 19/018528 |
| | | | | 327/108 |
| 2014/0347951 A1* | 11/2014 | Kim | .................... | G11C 11/4085 |
| | | | | 365/230.06 |
| 2015/0055394 A1* | 2/2015 | Iwasa | .................. | G11C 11/4085 |
| | | | | 365/72 |
| 2016/0062704 A1* | 3/2016 | Yamaoka | ............... | G06N 7/005 |
| | | | | 711/104 |
| 2016/0261243 A1* | 9/2016 | Adabi | ..................... | H03F 3/217 |

* cited by examiner

APPARATUS FOR PERFORMING SIGNAL DRIVING WITH AID OF METAL OXIDE SEMICONDUCTOR FIELD EFFECT TRANSISTOR

CROSS REFERENCE TO RELATED APPLICATIONS

This application claims the benefit of U.S. Provisional Application No. 61/948,566, which was filed on Mar. 6, 2014, and is included herein by reference.

BACKGROUND

The present invention relates to performance control of integrated circuits (ICs), such as input/output (I/O) signal control for a plurality of I/O terminals of a semiconductor chip and resonance control for these I/O terminals and some internal terminals thereof, and more particularly, to an apparatus for performing signal driving with aid of Metal Oxide Semiconductor Field Effect Transistor (MOSFET), and an associated IC.

According to the related art, a conventional memory control circuit for controlling a memory may comprise a set of terminals such as some memory input/output (I/O) terminals, where the memory I/O terminals can be used for transmitting or receiving memory I/O signals between the conventional memory control circuit and the memory mentioned above. More particularly, the conventional memory control circuit may comprise a driving unit for outputting an output signal through one of the memory I/O terminals. However, problems due to the conventional design of the driving unit may occur in some situations. For example, the operation of the driving unit implemented according to the related art may be hindered by the characteristics of a certain component within the driving unit. Therefore, a novel architecture is required for improving the performance of ICs.

SUMMARY

It is an objective of the claimed invention to provide an apparatus for performing signal driving with aid of Metal Oxide Semiconductor Field Effect Transistor (MOSFET), and an associated integrated circuit (IC), in order to solve the above-mentioned problems.

It is another objective of the claimed invention to provide an apparatus for performing signal driving with aid of MOSFET, and an associated IC, in order to enhance performance control of an electronic device.

According to at least one preferred embodiment, an apparatus for performing signal driving with aid of MOSFET is provided, where the apparatus comprises a P-type MOSFET (PMOSFET) that is coupled between a predetermined voltage level and a terminal, and further comprises an N-type MOSFET (NMOSFET) that is coupled between the predetermined voltage level and the terminal. The PMOSFET is arranged for selectively driving a signal, wherein the signal passes through the terminal. In addition, the NMOSFET is arranged for selectively driving the signal. Additionally, the apparatus further comprises another NMOSFET that is coupled between another predetermined voltage level and the terminal, wherein the other NMOSFET is arranged for selectively driving the signal. More particularly, the PMOSFET, the NMOSFET, and the other NMOSFET does not drive the signal at a same time. For example, any of the PMOSFET, the NMOSFET, and the other NMOSFET, such as each of the PMOSFET, the NMOSFET, and the other NMOSFET, may selectively drive the signal to have one of a plurality of logical states.

According to at least one preferred embodiment, an associated IC is provided, where the IC comprises two conductive wires, a function module, and at least one impedance component, wherein the function module is coupled between the two conductive wires, and the aforementioned at least one impedance component is coupled between the two conductive wires. The two conductive wires are arranged for conducting a predetermined voltage level and another predetermined voltage level, respectively. In addition, the function module is arranged for performing a plurality of functions of the IC, wherein at least one conductive wire within the two conductive wires provides the function module with power. Additionally, at least one portion of the aforementioned at least one impedance is arranged for performing resonance suppression for the IC.

It is an advantage of the present invention that the present invention apparatus and the associated resonance suppression apparatus can enhance performance control of ICs, such as input/output (I/O) signal control for a plurality of I/O terminals of a semiconductor chip and resonance control for these I/O terminals and some internal terminals thereof. As a result, the related art problems can be alleviated or prevented.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
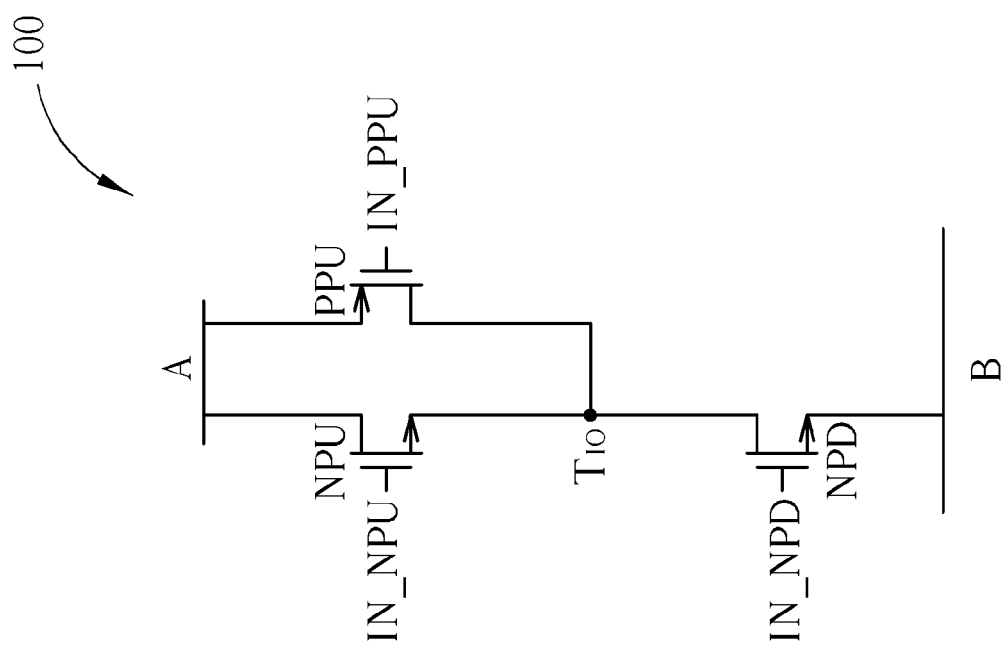
FIG. 1 is a diagram of an apparatus for performing signal driving with aid of Metal Oxide Semiconductor Field Effect Transistor (MOSFET) according to an embodiment of the present invention.

FIG. 1 is a diagram of an apparatus 100 for performing signal driving with aid of Metal Oxide Semiconductor Field Effect Transistor (MOSFET) according to an embodiment of the present invention. For example, the terminal $T_{IO}$ can be one of a set of memory input/output (I/O) terminals, where the apparatus 100 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 100 can be positioned in one of another type of circuits.

As shown in FIG. 1, the apparatus 100 comprises a P-type MOSFET (PMOSFET) PPU that is coupled between a predetermined voltage level A and a terminal such as the terminal $T_{IO}$, and further comprises an N-type MOSFET (NMOSFET) NPU that is coupled between the predetermined voltage level A and the terminal such as the terminal $T_{IO}$. The PMOSFET PPU is arranged for selectively driving a signal, where the signal passes through the terminal such as the terminal $T_{IO}$. In addition, the NMOSFET NPU is arranged for selectively driving the signal. Additionally, the apparatus 100 further comprises another NMOSFET NPD that is coupled between another predetermined voltage level B and the terminal such as the terminal $T_{IO}$, where the other NMOSFET NPD is arranged for selectively driving the signal mentioned above. Please note that the PMOSFET PPU, the NMOSFET NPU, and the other NMOSFET NPD does not drive the signal at the same time. For example, in a situation where the terminal such as the terminal $T_{IO}$ is one of the set of memory I/O terminals mentioned above, the signal that passes through the terminal such as the terminal $T_{IO}$ can be one of a set of memory I/O signals. This is for illustrative purposes only, and is not meant to be a limitation of the present invention.

According to this embodiment, any MOSFET within the PMOSFET PPU, the NMOSFET NPU, and the other NMOSFET NPD, such as each of the PMOSFET PPU, the NMOSFET NPU, and the other NMOSFET NPD, may selectively drive the signal to have one of a plurality of logical states. For example, the PMOSFET PPU and the NMOSFET NPU are arranged for selectively driving the signal to correspond to at least one logic state (e.g. one or more logic states) of the plurality of logical states, and the other NMOSFET NPD is arranged for selectively driving the signal to correspond to another logic state of the plurality of logical states, where any two logical states within the plurality of logical states do not exist at the same time.

In practice, the PMOSFET PPU is arranged for selectively driving the signal to have a voltage level associated to the predetermined voltage level A, such as a voltage level that is slightly lower than the predetermined voltage level A, and the NMOSFET NPU is arranged for selectively driving the signal to have another voltage level associated to the predetermined voltage level A, such as another voltage level that is slightly lower than the predetermined voltage level A, where the other NMOSFET NPD is arranged for selectively driving the signal to have a voltage level associated to the other predetermined voltage level B, such as a voltage level that is slightly higher than the other predetermined voltage level B. More particularly, any two voltage levels within the voltage level associated to the predetermined voltage level A, the other voltage level associated to the predetermined voltage level A, and the voltage level associated to the other predetermined voltage level B are different from each other. This is for illustrative purposes only, and is not meant to be a limitation of the present invention.

For better comprehension, a ground voltage level GND can be taken as an example of the other predetermined voltage level B, and a predetermined voltage level VDD that is higher than the ground voltage level GND can be taken as an example of the predetermined voltage level A. Based on the architecture shown in FIG. 1, the gate control signal IN_PPU of the PMOSFET PPU may selectively turn on the PMOSFET PPU, the gate control signal IN_NPU of the NMOSFET NPU may selectively turn on the NMOSFET NPU, and the gate control signal IN_NPD of the other NMOSFET NPD may selectively turn on the other NMOSFET NPD, where these gate control signals IN_PPU, IN_NPU, and IN_NPD do not turn on the PMOSFET PPU, the NMOSFET NPU, and the other NMOSFET NPD at the same time. For example, the gate control signal IN_PPU of the PMOSFET PPU may selectively turn on the PMOSFET PPU to drive the signal to have the voltage level associated to the predetermined voltage level A, such as the voltage level that is slightly lower than the predetermined voltage level A (e.g. a voltage level that is slightly lower than the predetermined voltage level VDD), and more particularly to pull up the signal to the voltage level associated to the predetermined voltage level A. In another example, the gate control signal IN_NPU of the NMOSFET NPU may selectively turn on the NMOSFET NPU to drive the signal to have the other voltage level associated to the predetermined voltage level A, such as the other voltage level that is slightly lower than the predetermined voltage level A (e.g. a voltage level that is slightly lower than the predetermined voltage level VDD), and more particularly to pull up the signal to the other voltage level associated to the predetermined voltage level A. In another example, the gate control signal IN_NPD of the other NMOSFET NPD may selectively turn on the other NMOSFET NPD to drive the signal to have the voltage level associated to the other predetermined voltage level B, such as the voltage level that is slightly higher than the other predetermined voltage level B (e.g. a voltage level that is slightly higher than the ground voltage level GND), and more particularly to pull down the signal to the voltage level associated to the other predetermined voltage level B.

As the architecture shown in FIG. 1 can be applied to various types of applications, the PMOSFET PPU and the NMOSFET NPU may selectively drive the signal to correspond to the aforementioned at least one logic state (e.g. one or more logic states) of the plurality of logical states, where the voltage level associated to the predetermined voltage level A and the other voltage level associated to the predetermined voltage level A are typically different from each other. For example, in a situation where the voltage level associated to the predetermined voltage level A and the other voltage level associated to the predetermined voltage level A represent the same logic state within the plurality of logical states, the PMOSFET PPU and the NMOSFET NPU may be arranged for selectively driving the signal to correspond to a single logic state within the plurality of logical states, such as the aforementioned same logic state. This is for illustrative purposes only, and is not meant to be a limitation of the present invention. In some examples, in a situation where the voltage level associated to the predetermined voltage level A and the other voltage level associated to the predetermined voltage level A represent different logic states within the plurality of logical states, respectively, the PMOSFET PPU and the NMOSFET NPU may be arranged for selectively driving the signal to correspond to two logic states within the plurality of logical states. That is, the PMOSFET PPU may selectively drive the signal to correspond to one logic state of the two logic states mentioned above, and the NMOSFET NPU may selectively drive the signal to correspond to the other logic state of the two logic states mentioned above.

According to some embodiments of the present invention, the apparatus 100 may further comprise at least one switching unit (e.g. one or more switching units, such as one or more MOSFETs) coupled between the predetermined voltage level A and the terminal such as the terminal $T_{IO}$, where the aforementioned at least one switching unit may be arranged for selectively enabling a driving path that passes through a MOSFET within the PMOSFET PPU and the NMOSFET NPU. For example, the apparatus 100 of one of these embodiments may comprise a switching unit (not shown in FIG. 1) that is coupled between the predetermined voltage level A and the terminal such as the terminal $T_{IO}$, where this switching unit is arranged for selectively enabling a driving path that passes through the PMOSFET PPU, and this switching unit and the PMOSFET PPU are electrically connected in series. In another example, the apparatus 100 of another one of these embodiments may comprise a switching unit (not shown in FIG. 1) that is coupled between the predetermined voltage level A and the terminal such as the terminal $T_{IO}$, where this switching unit is arranged for selectively enabling a driving path that passes through the NMOSFET NPU, and this switching unit and the NMOSFET NPU are electrically connected in series. This is for illustrative purposes only, and is not meant to be a limitation of the present invention.

According to some embodiments of the present invention, the apparatus 100 may further comprise at least one resistor (e.g. one or more resistors) coupled between the predetermined voltage level A and the terminal such as the terminal $T_{IO}$, where the aforementioned at least one resistor may be arranged for selectively adjusting a current on a driving path that passes through a MOSFET within the PMOSFET PPU and the NMOSFET NPU, such as the aforementioned MOSFET within the PMOSFET PPU and the NMOSFET NPU in the above embodiments, and may be arranged for selectively adjusting a voltage level at the terminal such as the terminal $T_{IO}$. For example, the apparatus 100 of one of these embodiments may comprise a resistor (not shown in FIG. 1) that is coupled between the predetermined voltage level A and the terminal such as the terminal $T_{IO}$, where this resistor is arranged for selectively adjusting a current on a driving path that passes through the PMOSFET PPU and is arranged for selectively adjusting a voltage level at the terminal such as the terminal $T_{IO}$, and this resistor and the PMOSFET PPU are electrically connected in series. In another example, the apparatus 100 of another one of these embodiments may comprise a resistor (not shown in FIG. 1) that is coupled between the predetermined voltage level A and the terminal such as the terminal $T_{IO}$, where this resistor is arranged for selectively adjusting a current on a driving path that passes through the NMOSFET NPU and is arranged for selectively adjusting a voltage level at the terminal such as the terminal $T_{IO}$, and this resistor and the NMOSFET NPU are electrically connected in series. This is for illustrative purposes only, and is not meant to be a limitation of the present invention.

According to some embodiments of the present invention, the apparatus 100 may further comprise at least one impedance component (e.g. one or more impedance components) coupled between the predetermined voltage level A and the other predetermined voltage level B, where the aforementioned at least one impedance component may be arranged for adjusting the frequency response observed at the terminal such as the terminal $T_{IO}$, and more particularly may be arranged for adjusting the impedance observed at the terminal such as the terminal $T_{IO}$. In practice, the aforementioned at least one impedance component may comprise a capacitor. For example, in the apparatus 100 of one or more embodiments within these embodiments, the aforementioned at least one impedance component may further comprise a resistor, where this resistor and the capacitor are electrically connected in series, and this resistor may be arranged for performing resonance suppression. This is for illustrative purposes only, and is not meant to be a limitation of the present invention. In some examples, the apparatus 100 of one or more other embodiments within these embodiments may further comprise a switching unit (not shown in FIG. 1) that is coupled between the predetermined voltage level A and the terminal such as the terminal $T_{IO}$, where this switching unit may be arranged for selectively enabling a driving path that passes through a MOSFET within the PMOSFET and the NMOSFET, such as the aforementioned MOSFET within the PMOSFET PPU and the NMOSFET NPU in the above embodiments. Typically, this switching unit and the aforementioned MOSFET are electrically connected in series, and this switching unit and the capacitor are electrically connected in series. More particularly, this switching unit can be a MOSFET and can be configured to play the role of a resistor such as that within the aforementioned at least one impedance component, and can be arranged for performing resonance suppression, where this MOSFET may have the resistive characteristic such as that of the aforementioned resistor within the aforementioned at least one impedance component.

According to some embodiments of the present invention, the apparatus 100 may further comprise a pre-driver (not shown in FIG. 1) that is coupled to the PMOSFET PPU, the NMOSFET NPU, and the other NMOSFET NPD. In addition, the pre-driver may be arranged for generating a plurality of control signals according to a plurality of input signals of the pre-driver. For example, the plurality of control signals may comprise the gate control signal IN_PPU of the PMOSFET PPU, the gate control signal IN_NPU of the NMOSFET NPU, and the gate control signal IN_NPD of the other NMOSFET NPD, where the gate control signals of the PMOSFET PPU, the NMOSFET NPU, and the other NMOSFET NPD (i.e. the gate control signals IN_PPU, IN_NPU, and IN_NPD) do not turn on the PMOSFET PPU, the NMOSFET NPU, and the other NMOSFET NPD at the same time. This is for illustrative purposes only, and is not meant to be a limitation of the present invention.

According to some embodiments of the present invention, the apparatus 100 may comprise an integrated circuit (IC) (not shown in FIG. 1), and the IC may comprise two conductive wires that are arranged for conducting the predetermined voltage level A and the other predetermined voltage level B, respectively, where the aforementioned at least one impedance component is coupled between the two conductive wires. In addition, in the apparatus 100 of these embodiments, the IC may further comprise an I/O module (not shown in FIG. 1) that is coupled between the two conductive wires, where the I/O module may comprise the PMOSFET PPU, the NMOSFET NPU, and the other NMOSFET NPD shown in FIG. 1, and more particularly, may comprise the architecture shown in FIG. 1. This is for illustrative purposes only, and is not meant to be a limitation of the present invention.

According to some embodiments of the present invention, the architecture of the IC mentioned above may be modified. More particularly, the IC of these embodiments may comprise two conductive wires such as that mentioned above, and may further comprise a function module and at least one impedance component such as that mentioned above, where the function module is coupled between the two conductive wires, and the aforementioned at least one impedance component is coupled between the two conductive wires. For example, the two conductive wires may be arranged for conducting the predetermined voltage level A (e.g. the predetermined voltage level VDD mentioned above) and the other predetermined voltage level B (e.g. the ground voltage level GND mentioned above), respectively. In addition, the function module may be arranged for performing a plurality of functions of the IC of these embodiments, where at least one conductive wire within the two conductive wires provides the function module with power. Additionally, at least one portion (e.g. a portion or all) of the aforementioned at least one impedance in the architecture of these embodiments may be arranged for performing resonance suppression for the IC of these embodiments. This is for illustrative purposes only, and is not meant to be a limitation of the present invention.

Figure 2:
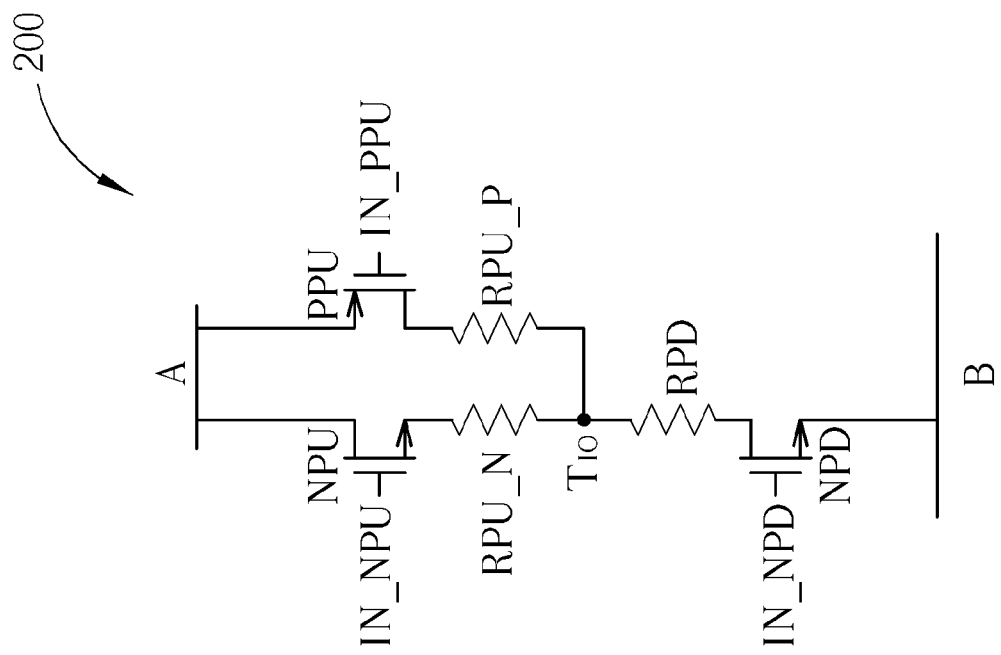
FIG. 2 is a diagram of an apparatus for performing signal driving with aid of MOSFET according to another embodiment of the present invention.

FIG. 2 is a diagram of an apparatus 200 for performing signal driving with aid of MOSFET according to another embodiment of the present invention. For example, the terminal $T_{IO}$ can be one of a set of memory I/O terminals such as that mentioned above, where the apparatus 200 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 200 can be positioned in one of another type of circuits.

As shown in FIG. 2, the apparatus 200 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$. In comparison with the architecture shown in FIG. 1, the apparatus 200 may comprise a plurality of resistors RPU_P and RPU_N, which can be taken as an example of the aforementioned at least one resistor. For example, the resistor RPU_P is coupled between the predetermined voltage level A and the terminal such as the terminal $T_{IO}$, and is arranged for selectively adjusting the current on the driving path that passes through the PMOSFET PPU and is arranged for selectively adjusting the voltage level at the terminal such as the terminal $T_{IO}$, and the resistor RPU_P and the PMOSFET PPU are electrically connected in series. In another example, the resistor RPU_N is coupled between the predetermined voltage level A and the terminal such as the terminal $T_{IO}$, and is arranged for selectively adjusting the current on the driving path that passes through the NMOSFET NPU and is arranged for selectively adjusting the voltage level at the terminal such as the terminal $T_{IO}$, and the resistor RPU_N and the NMOSFET NPU are electrically connected in series. For brevity, similar descriptions for this embodiment are not repeated in detail here.

Figure 3:
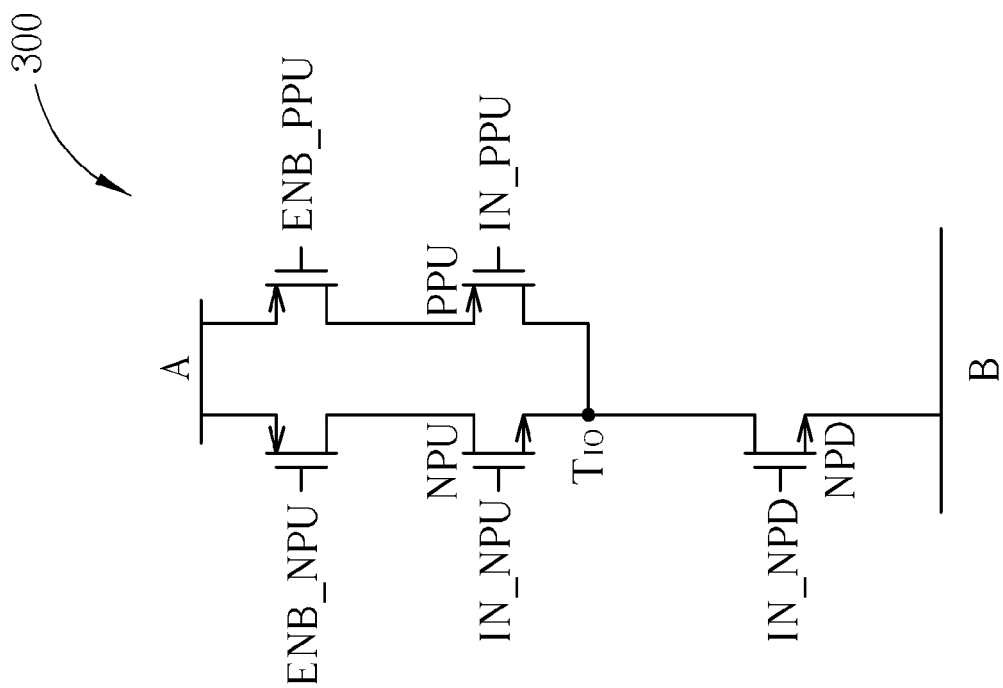
FIG. 3 is a diagram of an apparatus for performing signal driving with aid of MOSFET according to another embodiment of the present invention.

FIG. 3 is a diagram of an apparatus 300 for performing signal driving with aid of MOSFET according to another embodiment of the present invention. For example, the terminal $T_{IO}$ can be one of a set of memory I/O terminals such as that mentioned above, where the apparatus 300 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 300 can be positioned in one of another type of circuits.

As shown in FIG. 3, the apparatus 300 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$. In comparison with the architecture shown in FIG. 1, the apparatus 300 may comprise a plurality of switching units, such as the MOSFET controlled by the gate control signal ENB_PPU (i.e. the MOSFET illustrated around the upper right corner of FIG. 3) and the MOSFET controlled by the gate control signal ENB_NPU (i.e. the MOSFET illustrated around the upper left corner of FIG. 3), which can be taken as an example of the aforementioned at least one switching units. For example, one switching unit within the plurality of switching units, such as the MOSFET controlled by the gate control signal ENB_PPU (i.e. the MOSFET illustrated around the upper right corner of FIG. 3), is coupled between the predetermined voltage level A and the terminal such as the terminal $T_{IO}$, and is arranged for selectively enabling the driving path that passes through the PMOSFET PPU, and this switching unit and the PMOSFET PPU are electrically connected in series. In another example, another switching unit within the plurality of switching units, such as the MOSFET controlled by the gate control signal ENB_NPU (i.e. the MOSFET illustrated around the upper left corner of FIG. 3), is coupled between the predetermined voltage level A and the terminal such as the terminal $T_{IO}$, and is arranged for selectively enabling the driving path that passes through the NMOSFET NPU, and this switching unit and the NMOSFET NPU are electrically connected in series. For brevity, similar descriptions for this embodiment are not repeated in detail here.

Figure 4:
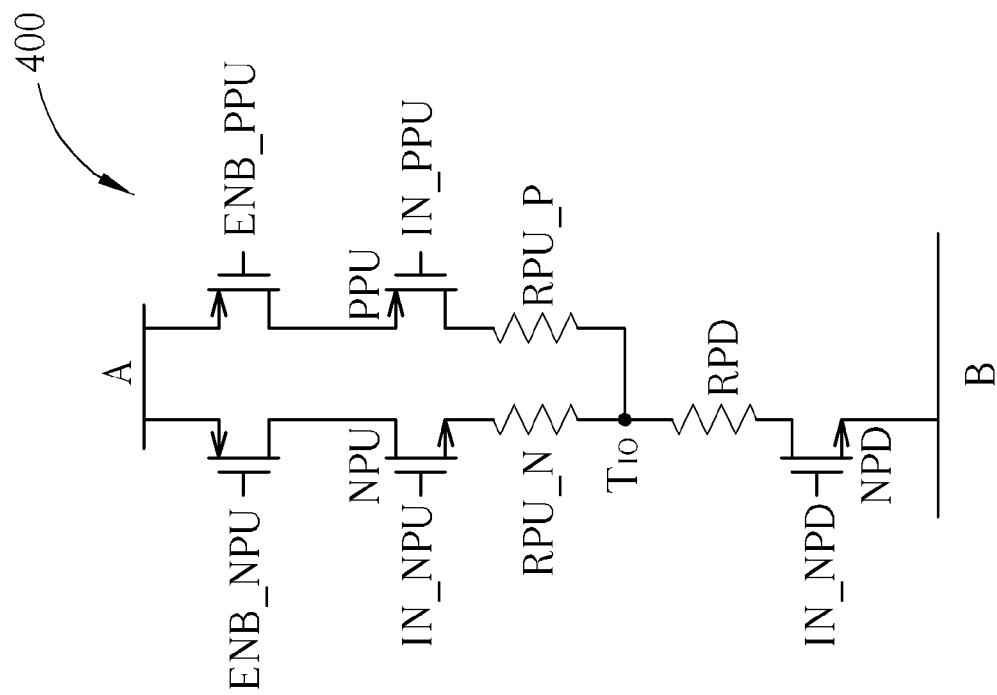
FIG. 4 is a diagram of an apparatus for performing signal driving with aid of MOSFET according to another embodiment of the present invention.

FIG. 4 is a diagram of an apparatus 400 for performing signal driving with aid of MOSFET according to another embodiment of the present invention. For example, the terminal $T_{IO}$ can be one of a set of memory I/O terminals such as that mentioned above, where the apparatus 400 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 400 can be positioned in one of another type of circuits.

As shown in FIG. 4, the apparatus 400 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$. In addition, the apparatus 400 may further comprise the plurality of resistors RPU_P and RPU_N mentioned above. In comparison with the architecture shown in FIG. 2, the apparatus 400 may comprise a plurality of switching units, such as the MOSFET controlled by the gate control signal ENB_PPU (i.e. the MOSFET illustrated around the upper right corner of FIG. 4) and the MOSFET controlled by the gate control signal ENB_NPU (i.e. the MOSFET illustrated around the upper left corner of FIG. 4), which can be taken as an example of the aforementioned at least one switching units. For example, one switching unit within the plurality of switching units, such as the MOSFET controlled by the gate control signal ENB_PPU (i.e. the MOSFET illustrated around the upper right corner of FIG. 4), is coupled between the predetermined voltage level A and the terminal such as the terminal $T_{IO}$, and is arranged for selectively enabling the driving path that passes through the PMOSFET PPU, and this switching unit and the PMOSFET PPU are electrically connected in series. In another example, another switching unit within the plurality of switching units, such as the MOSFET controlled by the gate control signal ENB_NPU (i.e. the MOSFET illustrated around the upper left corner of FIG. 4), is coupled between the predetermined voltage level A and the terminal such as the terminal $T_{IO}$, and is arranged for selectively enabling the driving path that passes through the NMOSFET NPU, and this switching unit and the NMOSFET NPU are electrically connected in series. For brevity, similar descriptions for this embodiment are not repeated in detail here.

Figure 5:
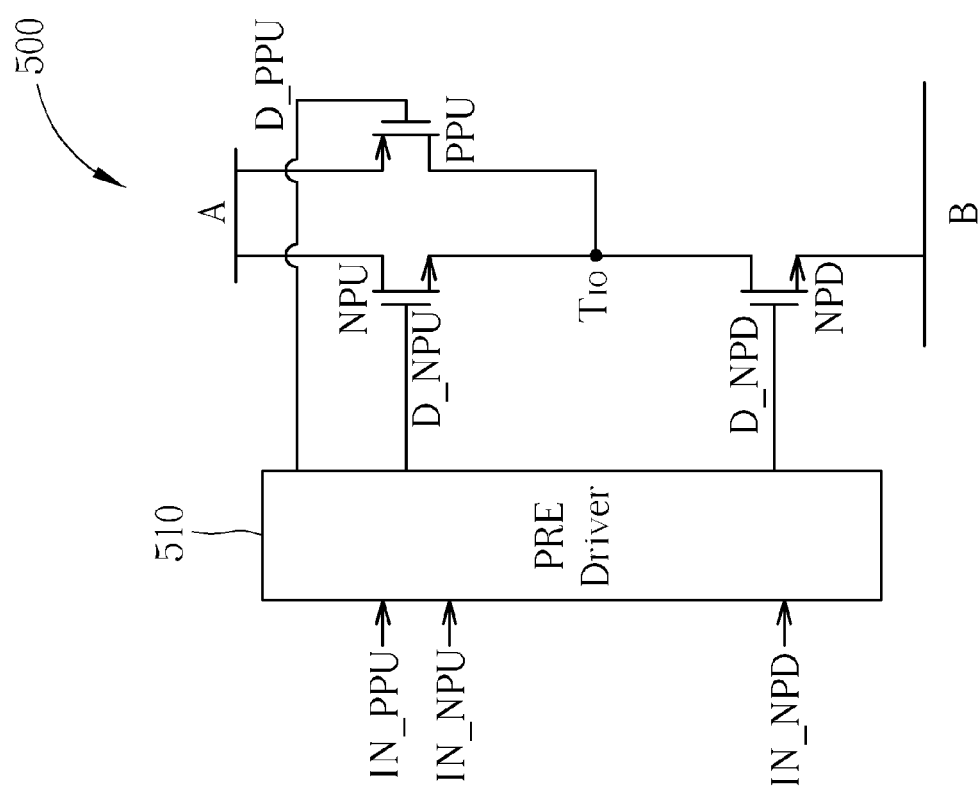
FIG. 5 is a diagram of an apparatus for performing signal driving with aid of MOSFET according to another embodiment of the present invention.

FIG. 5 is a diagram of an apparatus 500 for performing signal driving with aid of MOSFET according to another embodiment of the present invention. For example, the terminal $T_{IO}$ can be one of a set of memory I/O terminals such as that mentioned above, where the apparatus 500 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 500 can be positioned in one of another type of circuits.

As shown in FIG. 5, the apparatus 500 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$. In comparison with the architecture shown in FIG. 1, the apparatus 500 may comprise a pre-driver 510 that is coupled to the PMOSFET PPU, the NMOSFET NPU, and the other NMOSFET NPD through the gate control signals D_PPU, D_NPU, and D_NPD, respectively. Please note that the pre-driver 510 can be taken as an example of the aforementioned pre-driver of some embodiments described between the embodiment shown in FIG. 1 and the embodiment shown in FIG. 2, with the aforementioned gate control signals IN_PPU, IN_NPU, and IN_NPD being respectively replaced by the gate control signals D_PPU, D_NPU, and D_NPD, where the pre-driver 510 of this embodiment is arranged for generating the plurality of control signals such as the gate control signals D_PPU, D_NPU, and D_NPD according to the plurality of input signals of the pre-driver 510. For example, the plurality of input signals of the pre-driver 510 of this embodiment may comprise the gate control signals IN_PPU, IN_NPU, and IN_NPD of the embodiment shown in FIG. 1, where the gate control signals D_PPU, D_NPU, and D_NPD may correspond to the signals IN_PPU, IN_NPU, and IN_NPD of this embodiment, respectively. More particularly, the logical states of the gate control signals D_PPU, D_NPU, and D_NPD may correspond to that of the signals IN_PPU, IN_NPU, and IN_NPD in the architecture shown in FIG. 5, respectively. For brevity, similar descriptions for this embodiment are not repeated in detail here.

Figure 6:
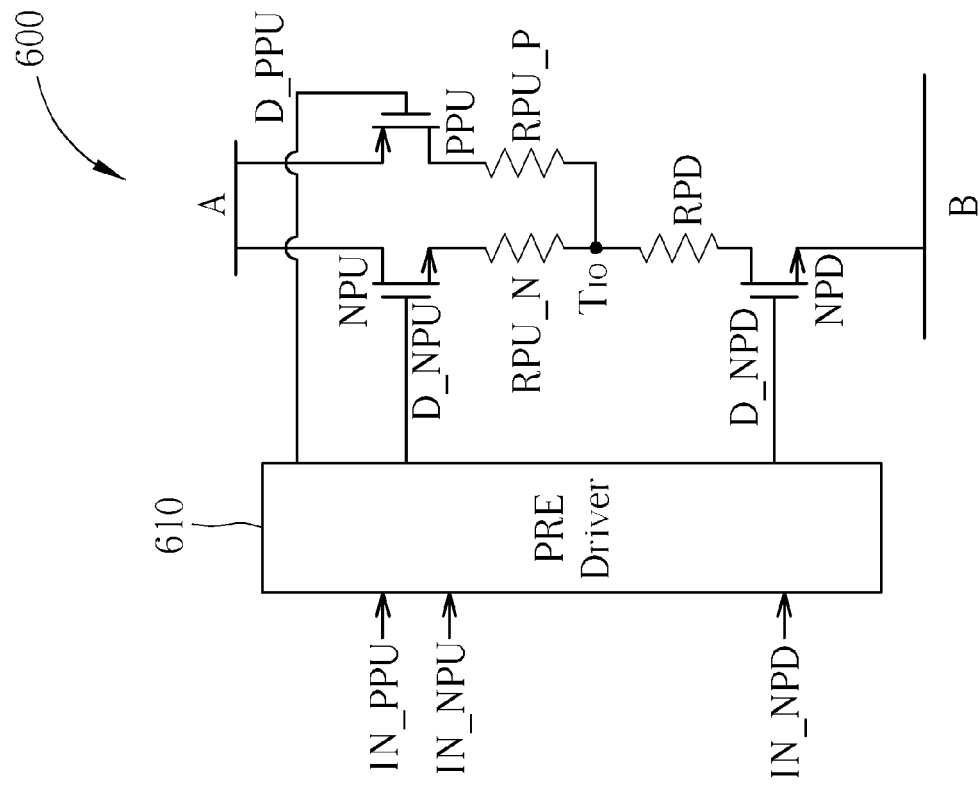
FIG. 6 is a diagram of an apparatus for performing signal driving with aid of MOSFET according to another embodiment of the present invention.

FIG. 6 is a diagram of an apparatus 600 for performing signal driving with aid of MOSFET according to another embodiment of the present invention. For example, the terminal $T_{IO}$ can be one of a set of memory I/O terminals such as that mentioned above, where the apparatus 600 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 600 can be positioned in one of another type of circuits.

As shown in FIG. 6, the apparatus 600 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$, and may further comprise the plurality of resistors RPU_P and RPU_N mentioned above. In comparison with the architecture shown in FIG. 2, the apparatus 600 may comprise a pre-driver 610 that is coupled to the PMOSFET PPU, the NMOSFET NPU, and the other NMOSFET NPD through the gate control signals D_PPU, D_NPU, and D_NPD, respectively. Please note that the pre-driver 610 can be taken as an example of the aforementioned pre-driver of some embodiments described between the embodiment shown in FIG. 1 and the embodiment shown in FIG. 2, with the aforementioned gate control signals IN_PPU, IN_NPU, and IN_NPD being respectively replaced by the gate control signals D_PPU, D_NPU, and D_NPD, where the pre-driver 610 of this embodiment is arranged for generating the plurality of control signals such as the gate control signals D_PPU, D_NPU, and D_NPD according to the plurality of input signals of the pre-driver 610. For example, the plurality of input signals of the pre-driver 610 of this embodiment may comprise the gate control signals IN_PPU, IN_NPU, and IN_NPD of the embodiment shown in FIG. 1, where the gate control signals D_PPU, D_NPU, and D_NPD may correspond to the signals IN_PPU, IN_NPU, and IN_NPD of this embodiment, respectively. More particularly, the logical states of the gate control signals D_PPU, D_NPU, and D_NPD may correspond to that of the signals IN_PPU, IN_NPU, and IN_NPD in the architecture shown in FIG. 6, respectively. For brevity, similar descriptions for this embodiment are not repeated in detail here.

Figures 7, 8:
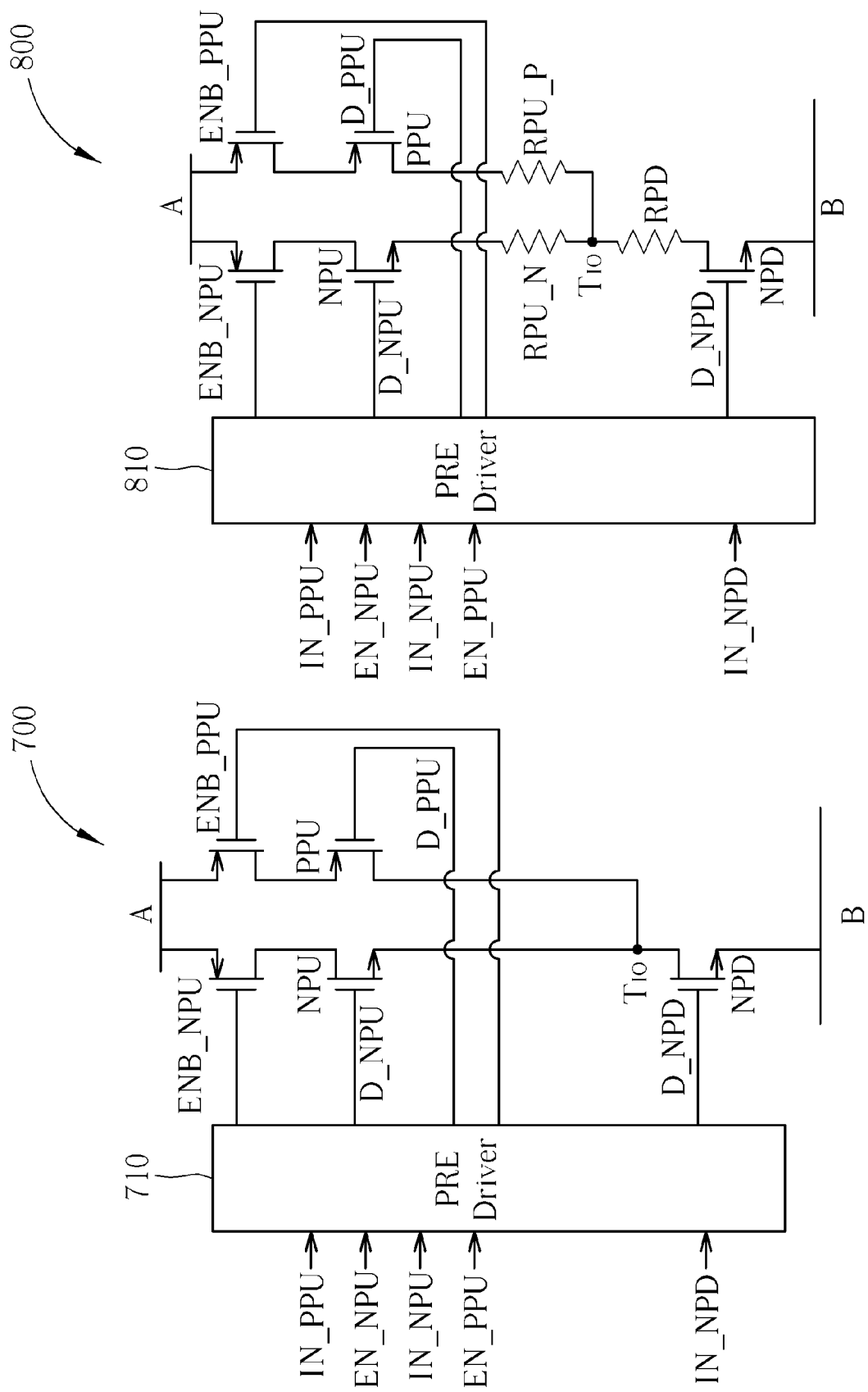
FIG. 7 is a diagram of an apparatus for performing signal driving with aid of MOSFET according to another embodiment of the present invention.
FIG. 8 is a diagram of an apparatus for performing signal driving with aid of MOSFET according to another embodiment of the present invention.

FIG. 7 is a diagram of an apparatus 700 for performing signal driving with aid of MOSFET according to another embodiment of the present invention. For example, the terminal $T_{IO}$ can be one of a set of memory I/O terminals such as that mentioned above, where the apparatus 700 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 700 can be positioned in one of another type of circuits.

As shown in FIG. 7, the apparatus 700 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$, and may further comprise the plurality of switching units mentioned in the embodiment shown in FIG. 3, such as the MOSFET controlled by the gate control signal ENB_PPU (i.e. the MOSFET illustrated around the upper right corner of FIG. 3) and the MOSFET controlled by the gate control signal ENB_NPU (i.e. the MOSFET illustrated around the upper left corner of FIG. 3). In comparison with the architecture shown in FIG. 3, the apparatus 700 may comprise a pre-driver 710 that is coupled to the PMOSFET PPU, the NMOSFET NPU, and the other NMOSFET NPD through the gate control signals D_PPU, D_NPU, and D_NPD, respectively. Please note that the pre-driver 710 can be taken as an example of the aforementioned pre-driver of some embodiments described between the embodiment shown in FIG. 1 and the embodiment shown in FIG. 2, with the aforementioned gate control signals IN_PPU, IN_NPU, and IN_NPD being respectively replaced by the gate control signals D_PPU, D_NPU, and D_NPD, where the pre-driver 710 of this embodiment is arranged for generating the plurality of control signals such as the gate control signals ENB_PPU, D_PPU, ENB_NPU, D_NPU, and D_NPD according to the plurality of input signals of the pre-driver 710. For example, the plurality of input signals of the pre-driver 710 of this embodiment may comprise the gate control signals IN_PPU, IN_NPU, and IN_NPD of the embodiment shown in FIG. 1, and may further comprise the control signals EN_PPU and EN_NPU that can be equivalent to the gate control signals ENB_PPU and ENB_NPU of the embodiment shown in FIG. 3, respectively, where the gate control signals ENB_PPU, D_PPU, ENB_NPU, D_NPU, and D_NPD in the architecture shown in FIG. 7 may correspond to the signals EN_PPU, IN_PPU, EN_NPU, IN_NPU, and IN_NPD of this embodiment, respectively. More particularly, the logical states of these gate control signals ENB_PPU, D_PPU, ENB_NPU, D_NPU, and D_NPD may correspond to that of the signals EN_PPU, IN_PPU, EN_NPU, IN_NPU, and IN_NPD in the architecture shown in FIG. 7, respectively. For brevity, similar descriptions for this embodiment are not repeated in detail here.

FIG. 8 is a diagram of an apparatus 800 for performing signal driving with aid of MOSFET according to another embodiment of the present invention. For example, the terminal $T_{IO}$ can be one of a set of memory I/O terminals such as that mentioned above, where the apparatus 800 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 800 can be positioned in one of another type of circuits.

As shown in FIG. 8, the apparatus 800 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$, and may further comprise the plurality of resistors RPU_P and RPU_N mentioned above and further comprise the plurality of switching units mentioned in the embodiment shown in FIG. 4, such as the MOSFET controlled by the gate control signal ENB_PPU (i.e. the MOSFET illustrated around the upper right corner of FIG. 4) and the MOSFET controlled by the gate control signal ENB_NPU (i.e. the MOSFET illustrated around the upper left corner of FIG. 4). In comparison with the architecture shown in FIG. 4, the apparatus 800 may comprise a pre-driver 810 that is coupled to the PMOSFET PPU, the NMOSFET NPU, and the other NMOSFET NPD through the gate control signals D_PPU, D_NPU, and D_NPD, respectively. Please note that the pre-driver 810 can be taken as an example of the aforementioned pre-driver of some embodiments described between the embodiment shown in FIG. 1 and the embodiment shown in FIG. 2, with the aforementioned gate control signals IN_PPU, IN_NPU, and IN_NPD being respectively replaced by the gate control signals D_PPU, D_NPU, and D_NPD, where the pre-driver 810 of this embodiment is arranged for generating the plurality of control signals such as the gate control signals ENB_PPU, D_PPU, ENB_NPU, D_NPU, and D_NPD according to the plurality of input signals of the pre-driver 810. For example, the plurality of input signals of the pre-driver 810 of this embodiment may comprise the gate control signals IN_PPU, IN_NPU, and IN_NPD of the embodiment shown in FIG. 1, and may further comprise the control signals EN_PPU and EN_NPU that can be equivalent to the gate control signals ENB_PPU and ENB_NPU of the embodiment shown in FIG. 4, respectively, where the gate control signals ENB_PPU, D_PPU, ENB_NPU, D_NPU, and D_NPD in the architecture shown in FIG. 8 may correspond to the signals EN_PPU, IN_PPU, EN_NPU, IN_NPU, and IN_NPD of this embodiment, respectively. More particularly, the logical states of these gate control signals ENB_PPU, D_PPU, ENB_NPU, D_NPU, and D_NPD may correspond to that of the signals EN_PPU, IN_PPU, EN_NPU, IN_NPU, and IN_NPD in the architecture shown in FIG. 8, respectively. For brevity, similar descriptions for this embodiment are not repeated in detail here.

Figures 9, 10:
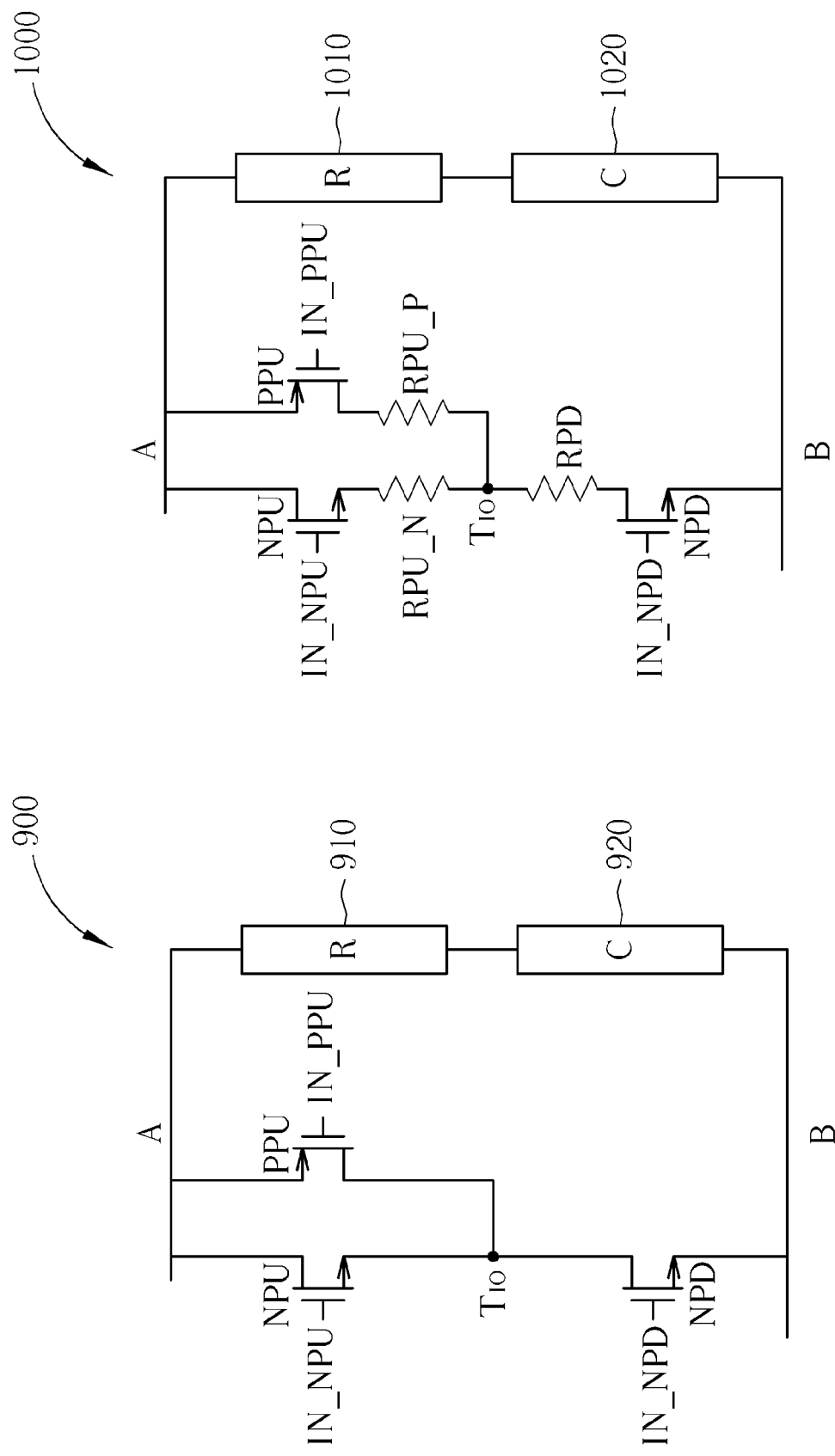
FIG. 9 is a diagram of an apparatus for performing signal driving with aid of MOSFET according to another embodiment of the present invention.
FIG. 10 is a diagram of an apparatus for performing signal driving with aid of MOSFET according to another embodiment of the present invention.

FIG. 9 is a diagram of an apparatus 900 for performing signal driving with aid of MOSFET according to another embodiment of the present invention. For example, the terminal $T_{IO}$ can be one of a set of memory I/O terminals such as that mentioned above, where the apparatus 900 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 900 can be positioned in one of another type of circuits.

As shown in FIG. 9, the apparatus 900 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$. In comparison with the architecture shown in FIG. 1, the apparatus 900 may further comprise a resistor 910 (labeled "R" in FIG. 9, for brevity) and a capacitor 920 (labeled "C" in FIG. 9, for brevity) that are coupled between the predetermined voltage level A and the terminal such as the terminal $T_{IO}$. Please note that the resistor 910 and the capacitor 920 can be taken as an example of the aforementioned at least one impedance component of some embodiments described between the embodiment shown in FIG. 1 and the embodiment shown in FIG. 2. In practice, the apparatus 900 may use the resistor 910 to enhance the resistance-inductance-capacitance (R-L-C) characteristics of the architecture shown in FIG. 9. For brevity, similar descriptions for this embodiment are not repeated in detail here.

FIG. 10 is a diagram of an apparatus 1000 for performing signal driving with aid of MOSFET according to another embodiment of the present invention. For example, the terminal $T_{IO}$ can be one of a set of memory I/O terminals such as that mentioned above, where the apparatus 1000 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 1000 can be positioned in one of another type of circuits.

As shown in FIG. 10, the apparatus 1000 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$, and may further comprise the plurality of resistors RPU_P and RPU_N mentioned above. In comparison with the architecture shown in FIG. 2, the apparatus 1000 may further comprise a resistor 1010 (labeled "R" in FIG. 10, for brevity) and a capacitor 1020 (labeled "C" in FIG. 10, for brevity) that are coupled between the predetermined voltage level A and the terminal such as the terminal $T_{IO}$. Please note that the resistor 1010 and the capacitor 1020 can be taken as an example of the aforementioned at least one impedance component of some embodiments described between the embodiment shown in FIG. 1 and the embodiment shown in FIG. 2. In practice, the apparatus 1000 may use the resistor 1010 to enhance the R-L-C characteristics of the architecture shown in FIG. 10. For brevity, similar descriptions for this embodiment are not repeated in detail here.

Figures 11, 12:
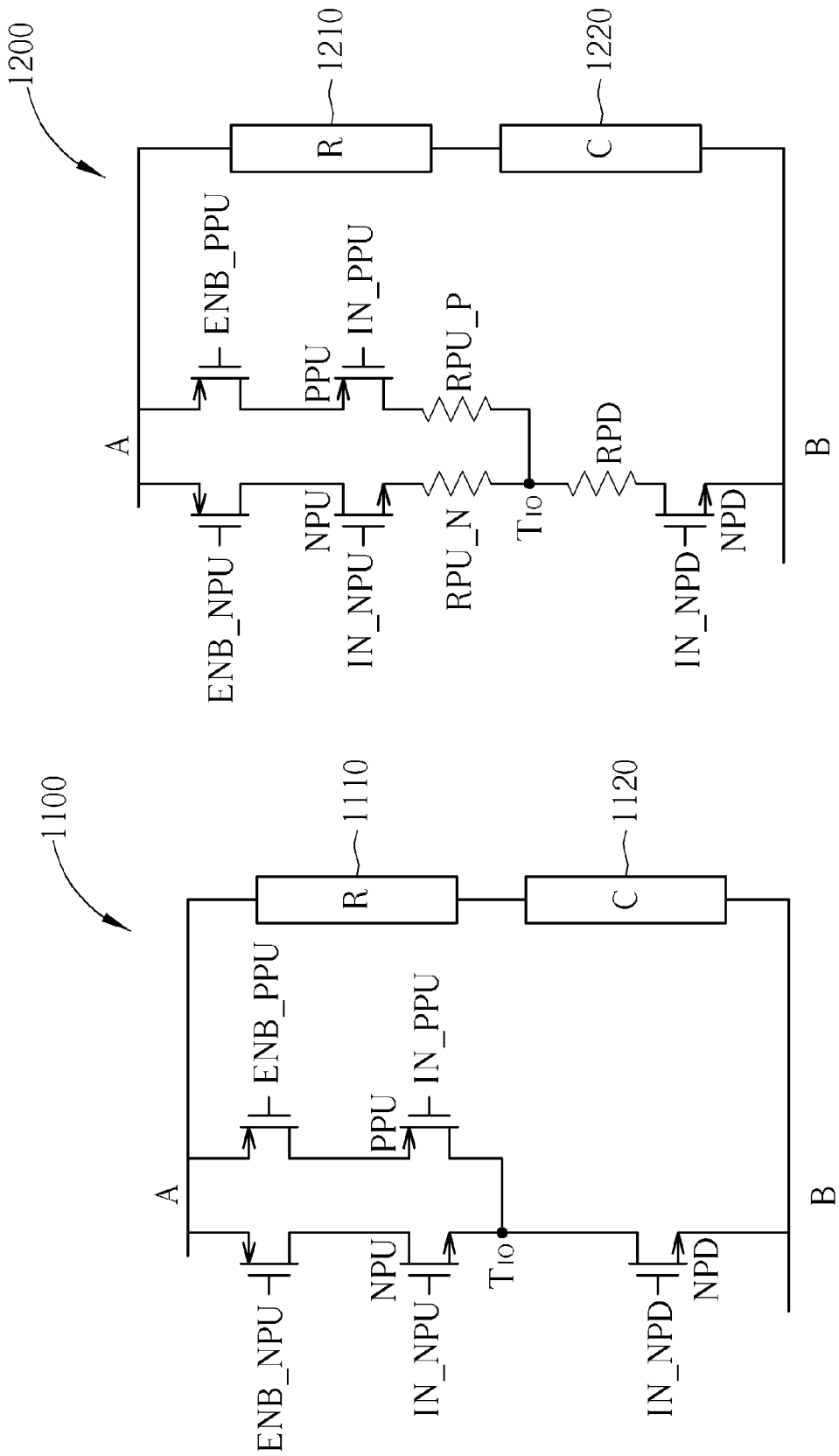
FIG. 11 is a diagram of an apparatus for performing signal driving with aid of MOSFET according to another embodiment of the present invention.
FIG. 12 is a diagram of an apparatus for performing signal driving with aid of MOSFET according to another embodiment of the present invention.

FIG. 11 is a diagram of an apparatus 1100 for performing signal driving with aid of MOSFET according to another embodiment of the present invention. For example, the terminal $T_{IO}$ can be one of a set of memory I/O terminals such as that mentioned above, where the apparatus 1100 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 1100 can be positioned in one of another type of circuits.

As shown in FIG. 11, the apparatus 1100 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$, and may further comprise the plurality of switching units mentioned in the embodiment shown in FIG. 3, such as the MOSFET controlled by the gate control signal ENB_PPU (i.e. the MOSFET illustrated around the upper right corner of FIG. 3) and the MOSFET controlled by the gate control signal ENB_NPU (i.e. the MOSFET illustrated around the upper left corner of FIG. 3). In comparison with the architecture shown in FIG. 3, the apparatus 1100 may further comprise a resistor 1110 (labeled "R" in FIG. 11, for brevity) and a capacitor 1120 (labeled "C" in FIG. 11, for brevity) that are coupled between the predetermined voltage level A and the terminal such as the terminal $T_{IO}$. Please note that the resistor 1110 and the capacitor 1120 can be taken as an example of the aforementioned at least one impedance component of some embodiments described between the embodiment shown in FIG. 1 and the embodiment shown in FIG. 2. In practice, the apparatus 1100 may use the resistor 1110 to enhance the R-L-C characteristics of the architecture shown in FIG. 11. For brevity, similar descriptions for this embodiment are not repeated in detail here.

FIG. 12 is a diagram of an apparatus 1200 for performing signal driving with aid of MOSFET according to another embodiment of the present invention. For example, the terminal $T_{IO}$ can be one of a set of memory I/O terminals such as that mentioned above, where the apparatus 1200 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 1200 can be positioned in one of another type of circuits.

As shown in FIG. 12, the apparatus 1200 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$, and may further comprise the plurality of resistors RPU_P and RPU_N mentioned above and further comprise the plurality of switching units mentioned in the embodiment shown in FIG. 4, such as the MOSFET controlled by the gate control signal ENB_PPU (i.e. the MOSFET illustrated around the upper right corner of FIG. 4) and the MOSFET controlled by the gate control signal ENB_NPU (i.e. the MOSFET illustrated around the upper left corner of FIG. 4). In comparison with the architecture shown in FIG. 4, the apparatus 1200 may further comprise a resistor 1210 (labeled "R" in FIG. 12, for brevity) and a capacitor 1220 (labeled "C" in FIG. 12, for brevity) that are coupled between the predetermined voltage level A and the terminal such as the terminal $T_{IO}$. Please note that the resistor 1210 and the capacitor 1220 can be taken as an example of the aforementioned at least one impedance component of some embodiments described between the embodiment shown in FIG. 1 and the embodiment shown in FIG. 2. In practice, the apparatus 1200 may use the resistor 1210 to enhance the R-L-C characteristics of the architecture shown in FIG. 12. For brevity, similar descriptions for this embodiment are not repeated in detail here.

Figures 13, 14:
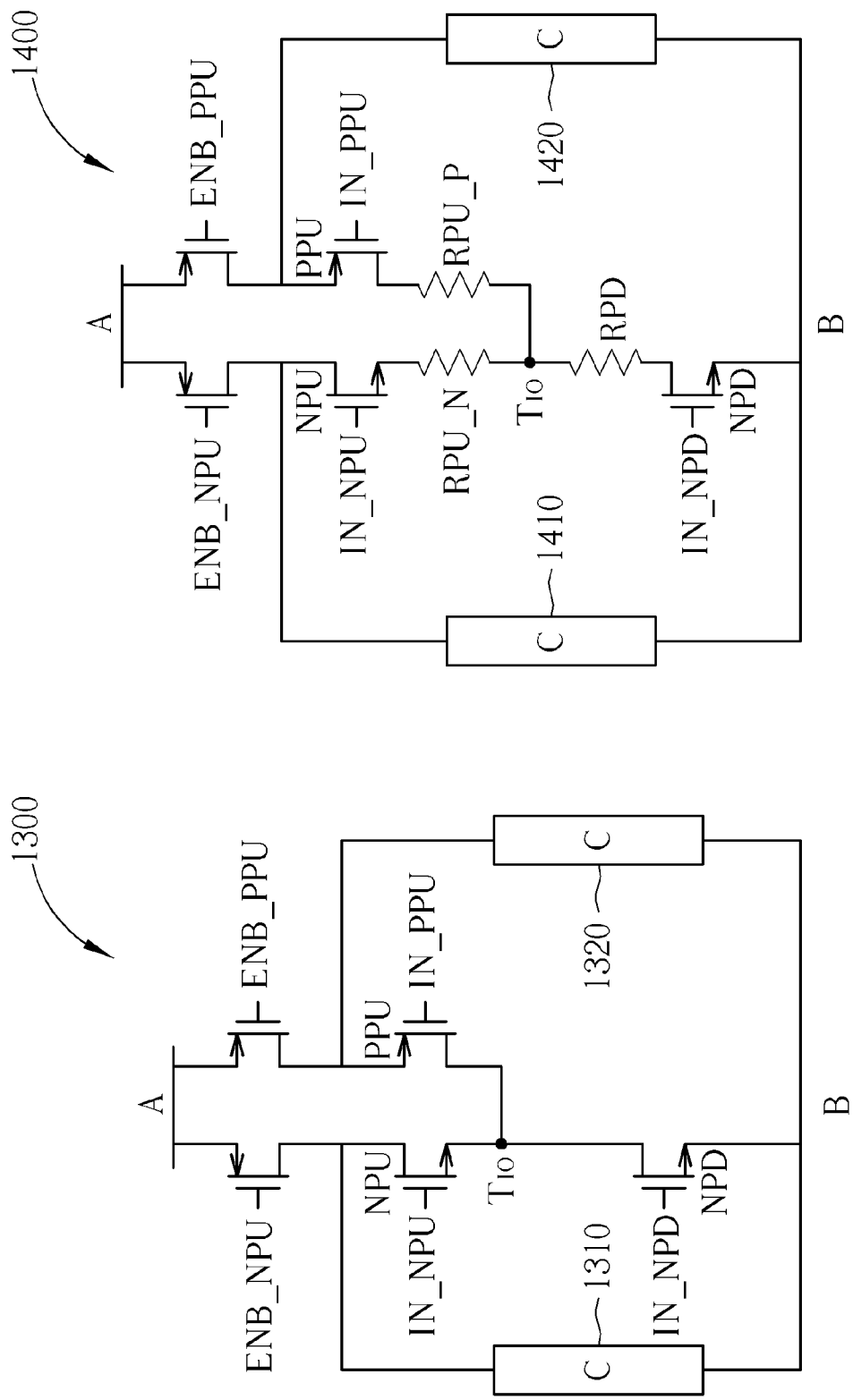
FIG. 13 is a diagram of an apparatus for performing signal driving with aid of MOSFET according to another embodiment of the present invention.
FIG. 14 is a diagram of an apparatus for performing signal driving with aid of MOSFET according to another embodiment of the present invention.

FIG. 13 is a diagram of an apparatus 1300 for performing signal driving with aid of MOSFET according to another embodiment of the present invention. For example, the terminal $T_{IO}$ can be one of a set of memory I/O terminals such as that mentioned above, where the apparatus 1300 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 1300 can be positioned in one of another type of circuits.

As shown in FIG. 13, the apparatus 1300 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$, and may further comprise the plurality of switching units mentioned in the embodiment shown in FIG. 3, such as the MOSFET controlled by the gate control signal ENB_PPU (i.e. the MOSFET illustrated around the upper right corner of FIG. 3) and the MOSFET controlled by the gate control signal ENB_NPU (i.e. the MOSFET illustrated around the upper left corner of FIG. 3). In comparison with the architecture shown in FIG. 3, the apparatus 1300 may further comprise a plurality of capacitors 1310 and 1320 (respectively labeled "C" in FIG. 13, for brevity) that are coupled between the other predetermined voltage level B and the terminal such as the terminal $T_{IO}$. Please note that the plurality of capacitors 1310 and 1320 can be taken as an example of the aforementioned at least one impedance component of some embodiments described between the embodiment shown in FIG. 1 and the embodiment shown in FIG. 2. In addition, any switching unit within the plurality of switching units of this embodiment can be taken as an example of the switching unit configured to play the aforementioned role of the resistor of some embodiments described between the embodiment shown in FIG. 1 and the embodiment shown in FIG. 2. In practice, the apparatus 1300 may use the plurality of switching units of this embodiment to enhance the R-L-C characteristics of the architecture shown in FIG. 13. For brevity, similar descriptions for this embodiment are not repeated in detail here.

FIG. 14 is a diagram of an apparatus 1400 for performing signal driving with aid of MOSFET according to another embodiment of the present invention. For example, the terminal $T_{IO}$ can be one of a set of memory I/O terminals such as that mentioned above, where the apparatus 1400 can be positioned in a memory control circuit having the set of memory I/O terminals. This is for illustrative purposes only, and is not meant to be a limitation of the present invention. In some examples, the terminal $T_{IO}$ can be one of another type of I/O terminals, where the apparatus 1400 can be positioned in one of another type of circuits.

As shown in FIG. 14, the apparatus 1400 may comprise the aforementioned PMOSFET PPU and the aforementioned NMOSFET NPU that are coupled between the predetermined voltage level A and the terminal such as the terminal $T_{IO}$, and may further comprise the aforementioned NMOSFET NPD that is coupled between the other predetermined voltage level B and the terminal such as the terminal $T_{IO}$, and may further comprise the plurality of resistors RPU_P and RPU_N mentioned above and further comprise the plurality of switching units mentioned in the embodiment shown in FIG. 4, such as the MOSFET controlled by the gate control signal ENB_PPU (i.e. the MOSFET illustrated around the upper right corner of FIG. 4) and the MOSFET controlled by the gate control signal ENB_NPU (i.e. the MOSFET illustrated around the upper left corner of FIG. 4). In comparison with the architecture shown in FIG. 4, the apparatus 1400 may further comprise a plurality of capacitors 1410 and 1420 (respectively labeled "C" in FIG. 14, for brevity) that are coupled between the other predetermined voltage level B and the terminal such as the terminal $T_{IO}$. Please note that the plurality of capacitors 1410 and 1420 can be taken as an example of the aforementioned at least one impedance component of some embodiments described between the embodiment shown in FIG. 1 and the embodiment shown in FIG. 2. In addition, any switching unit within the plurality of switching units of this embodiment can be taken as an example of the switching unit configured to play the aforementioned role of the resistor of some embodiments described between the embodiment shown in FIG. 1 and the embodiment shown in FIG. 2. In practice, the apparatus 1400 may use the plurality of switching units of this embodiment to enhance the R-L-C characteristics of the architecture shown in FIG. 14. For brevity, similar descriptions for this embodiment are not repeated in detail here.

Figure 15:
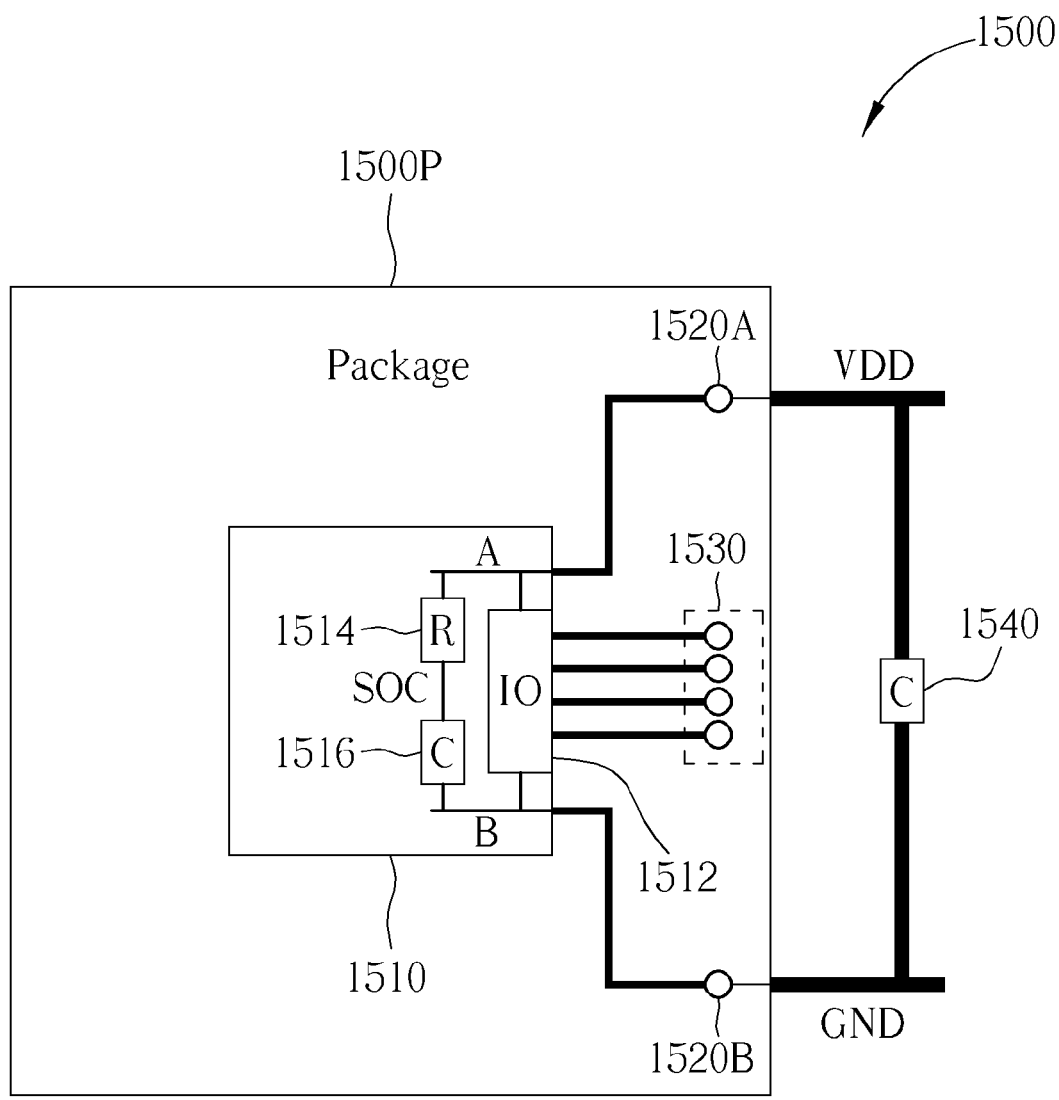
FIG. 15 is a diagram of an apparatus for performing signal driving with aid of MOSFET according to another embodiment of the present invention, where this apparatus comprises an integrated circuit (IC).

FIG. 15 is a diagram of an apparatus 1500 for performing signal driving with aid of MOSFET according to another embodiment of the present invention, where this apparatus 1500 may comprise an IC 1510. According to this embodiment, the IC 1510 may comprise an I/O module 1512 (labeled "IO" in FIG. 15, for brevity), which can be taken as an example of the aforementioned I/O module of some embodiments described between the embodiment shown in FIG. 1 and the embodiment shown in FIG. 2, and may further comprise a resistor 1514 (labeled "R" in FIG. 15, for brevity) and a capacitor 1516 (labeled "C" in FIG. 15, for brevity), which can be taken as an example of the aforementioned at least one impedance component of those embodiments. For example, the I/O module 1512 may comprise multiple copies of the MOSFETs shown in FIG. 1 (e.g. the PMOSFET PPU, the NMOSFET NPU, and the other NMOSFET NPD) and the corresponding terminals $\{T_{IO}\}$, and more particularly, may comprise at least one copies (e.g. one or more copies) of any of the architectures respectively shown in FIG. 1, FIG. 2, FIG. 3, FIG. 4, FIG. 5, FIG. 6, FIG. 7, and FIG. 8. For example, a terminal within the corresponding terminals $\{T_{IO}\}$ can be one of a set of memory I/O terminals such as that mentioned above, where the I/O module 1512 may comprise a memory control circuit having the set of memory I/O terminals. This is for illustrative purposes only, and is not meant to be a limitation of the present invention. In some examples, a terminal within the corresponding terminals $\{T_{IO}\}$ can be one of another type of I/O terminals, where the I/O module 1512 may comprise another type of circuits.

For example, the IC 1510 can be a semiconductor chip within a system on chip (SOC, or SoC) architecture, and therefore the IC 1510 can be labeled "SOC" and the internal electrical connections of the IC 1510 (e.g. the aforementioned two conductive wires that are arranged for respectively conducting the predetermined voltage level A and the other predetermined voltage level B in this embodiment, and the electrical connections between some of the I/O module 1512, the resistor 1514, the capacitor 1516, and the two conductive wires) can be illustrated with SOC metal, for better comprehension. This is for illustrative purposes only, and is not meant to be a limitation of the present invention. In some examples, IC 1510 can be a chip within one of another type of architectures. As shown in FIG. 15, the apparatus 1500 may comprise a package 1500P for packaging the IC 1510, where the package 1500P may comprise a plurality of terminals 1520A, 1520B, and 1530 coupled to the IC 1510. More particularly, the terminals 1530 can be coupled to the corresponding terminals $\{T_{IO}\}$ of the IC 1510. For better comprehension, a package implemented with the Ball Grid Array (BGA) technologies can be taken as an example of the package 1500P, and therefore the terminals 1520A, 1520B, and 1530 can be illustrated with balls and the electrical connections between the IC 1510 and the terminals 1520A, 1520B, and 1530 can be illustrated with package trace, for example. This is for illustrative purposes only, and is not meant to be a limitation of the present invention. In some examples, the package 1500P can be implemented with another type of technologies, such as Quad Flat Package (QFP) technologies, Dual In-line Package (DIP) technologies, Pin Grid Array (PGA) technologies, etc.

In practice, the package 1500P can be installed on a printed circuit board (PCB) of the electronic device mentioned above. For example, the PCB may comprise a plurality of PCB traces, where a PCB trace within the plurality of PCB traces may be arranged to conduct a predetermined voltage level VDD such as that mentioned above to the terminal 1520A of the package 1500P, and another PCB trace within the plurality of PCB traces may be arranged to conduct a ground voltage level GND such as that mentioned above to the terminal 1520B of the package 1500P. As a result, the predetermined voltage level A of this embodiment can be equivalent to the predetermined voltage level VDD, and the other predetermined voltage level B of this embodiment can be equivalent to the ground voltage level GND. In addition, the PCB may further comprise a capacitor 1540 (labeled "C" in FIG. 15, for brevity) that are coupled between the predetermined voltage level VDD and the ground voltage level GND of this embodiment. This is for illustrative purposes only, and is not meant to be a limitation of the present invention. According to some embodiments of the present invention, it is unnecessary to implement the capacitor 1540. For brevity, similar descriptions for this embodiment are not repeated in detail here.

Figure 16:
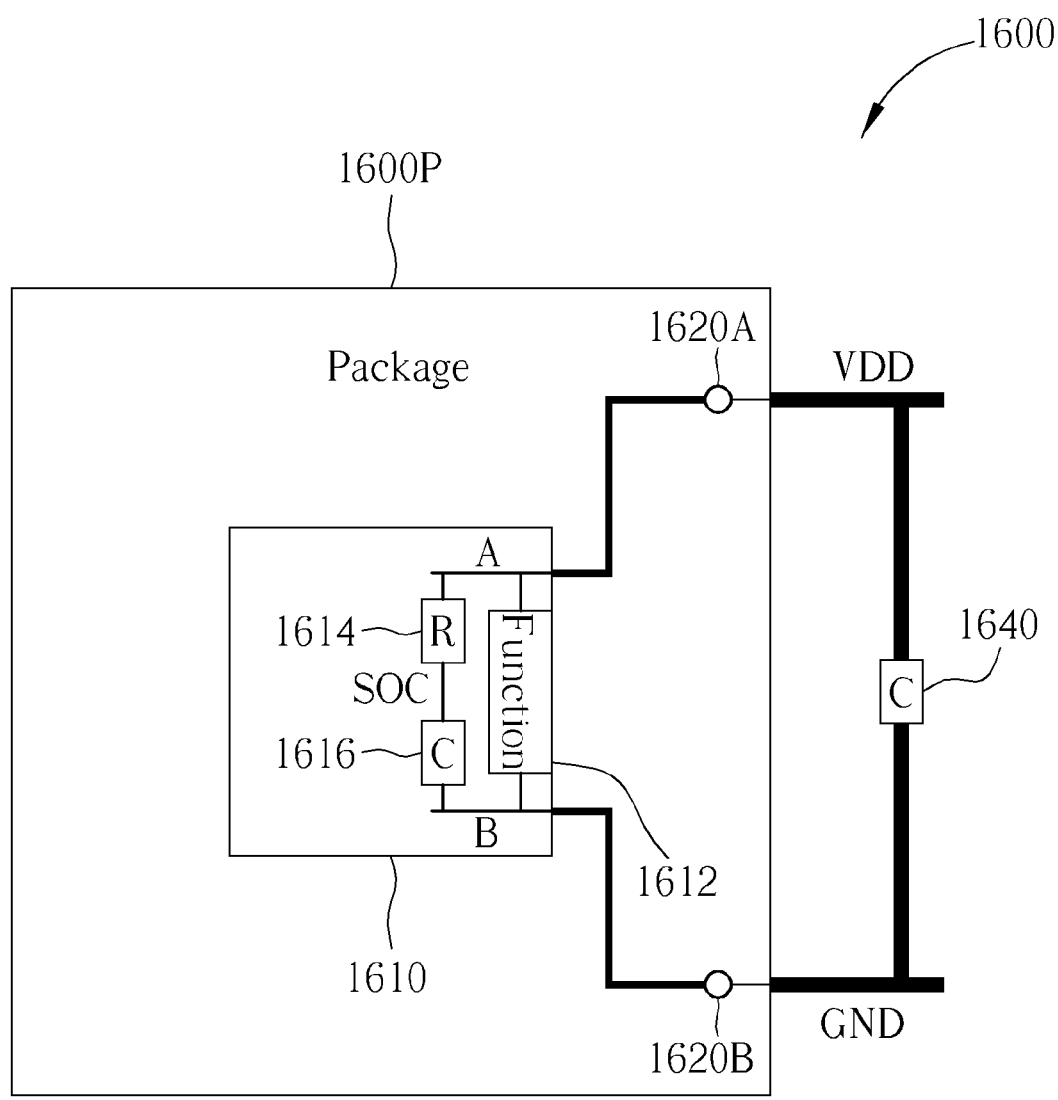
FIG. 16 is a diagram of an apparatus that is capable of performing resonance suppression according to an embodiment of the present invention, where this apparatus comprises an IC.

FIG. 16 is a diagram of an apparatus 1600 that is capable of performing resonance suppression according to an embodiment of the present invention, where this apparatus 1600 comprises an IC 1610. According to this embodiment, the IC 1610 may comprise a function module 1612 (labeled "Function" in FIG. 16, for brevity), which can be taken as an example of the aforementioned function module of some embodiments described between the embodiment shown in FIG. 1 and the embodiment shown in FIG. 2, and may further comprise a resistor 1614 (labeled "R" in FIG. 16, for brevity) and a capacitor 1616 (labeled "C" in FIG. 16, for brevity), which can be taken as an example of the aforementioned at least one impedance component of those embodiments.

For example, the IC 1610 can be a semiconductor chip within a SOC (or SoC) architecture, and therefore the IC 1610 can be labeled "SOC" and the internal electrical connections of the IC 1610 (e.g. the aforementioned two conductive wires that are arranged for respectively conducting the predetermined voltage level A and the other predetermined voltage level B in this embodiment, and the electrical connections between some of the function module 1612, the resistor 1614, the capacitor 1616, and the two conductive wires) can be illustrated with SOC metal, for better comprehension. This is for illustrative purposes only, and is not meant to be a limitation of the present invention. In some examples, IC 1610 can be a chip within one of another type of architectures. As shown in FIG. 16, the apparatus 1600 may comprise a package 1600P for packaging the IC 1610, where the package 1600P may comprise a plurality of terminals 1620A and 1620B coupled to the IC 1610. For better comprehension, a package implemented with the BGA technologies can be taken as an example of the package 1600P, and therefore the terminals 1620A and 1620B can be illustrated with balls and the electrical connections between the IC 1610 and the terminals 1620A and 1620B can be illustrated with package trace, for example. This is for illustrative purposes only, and is not meant to be a limitation of the present invention. In some examples, the package 1600P can be implemented with another type of technologies, such as QFP technologies, DIP technologies, PGA technologies, etc.

In practice, the package 1600P can be installed on a PCB of the electronic device mentioned above. For example, the PCB may comprise a plurality of PCB traces, where a PCB trace within the plurality of PCB traces may be arranged to conduct a predetermined voltage level VDD such as that mentioned above to the terminal 1620A of the package 1600P, and another PCB trace within the plurality of PCB traces may be arranged to conduct a ground voltage level GND such as that mentioned above to the terminal 1620B of the package 1600P. As a result, the predetermined voltage level A of this embodiment can be equivalent to the predetermined voltage level VDD, and the other predetermined voltage level B of this embodiment can be equivalent to the ground voltage level GND. In addition, the PCB may further comprise a capacitor 1640 (labeled "C" in FIG. 16, for brevity) that are coupled between the predetermined voltage level VDD and the ground voltage level GND of this embodiment. This is for illustrative purposes only, and is not meant to be a limitation of the present invention. According to some embodiments of the present invention, it is unnecessary to implement the capacitor 1640. For brevity, similar descriptions for this embodiment are not repeated in detail here.

Figure 17:
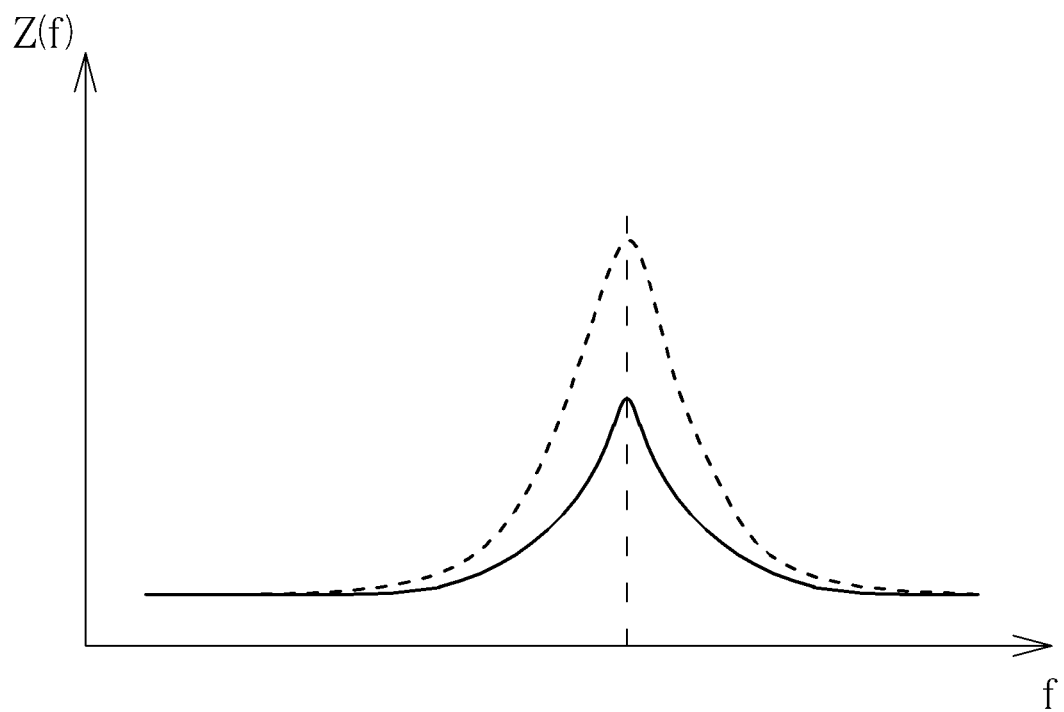
FIG. 17 illustrates a curve of the frequency-domain impedance of a system according to an embodiment of the present invention.

FIG. 17 illustrates a curve of the frequency-domain impedance of a system according to an embodiment of the present invention, where the impedance Z of the system may vary as a function Z (f) of frequency f. For example, within the two curves shown in FIG. 17, the curve depicted with the non-dashed line may represent the impedance Z of the system of this embodiment, and the curve depicted with the dashed line may represent the impedance Z of a conventional system in the related art. This is for illustrative purposes only, and is not meant to be a limitation of the present invention.

According to this embodiment, the system may comprise any of the architectures respectively shown in FIG. 9, FIG. 10, FIG. 11, FIG. 12, FIG. 13, FIG. 14, FIG. 15, and FIG. 16. More particularly, the impedance Z of the system can be the impedance observed at a node of the system. For example, this node may represent the aforementioned terminal of the embodiment shown in FIG. 1, such as the terminal $T_{IO}$ in any of the architectures respectively shown in FIG. 9, FIG. 10, FIG. 11, FIG. 12, FIG. 13, and FIG. 14. In another example, this node may represent the aforementioned terminal of the embodiment shown in FIG. 1, such as any of the corresponding terminals $\{T_{IO}\}$ in the architecture shown in FIG. 15. In another example, this node may represent a node within of the IC 1610 (e.g. an internal terminal of the IC 1610) in the architecture shown in FIG. 16. Please note that, no matter whether the system comprises which of the architectures respectively shown in FIG. 9, FIG. 10, FIG. 11, FIG. 12, FIG. 13, FIG. 14, FIG. 15, and FIG. 16, the system of this embodiment is capable of performing resonance suppression. As a result, the peak in the curve of the system of this embodiment can be lower than that of the conventional system of the related art. For brevity, similar descriptions for this embodiment are not repeated in detail here.

According to some embodiments of the present invention, de-coupling capacitors in ICs can be implemented with long channel MOSFETs. As the quality factors of de-coupling capacitors may become better in a new process of IC implementation, the resonance problem due to the change of the de-coupling capacitors in the new process with respect to a previous process may occur and degrade the performance of electronic devices. Therefore, by implementing ICs according to any of the embodiments respectively shown in FIG. 9, FIG. 10, FIG. 11, FIG. 12, FIG. 13, FIG. 14, FIG. 15, and FIG. 16, the resonance problem can be resolved and the performance of electronic devices can be guaranteed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing signal driving with aid of Metal Oxide Semiconductor Field Effect Transistor (MOSFET), the apparatus comprising:
   a P-type MOSFET (PMOSFET), coupled between a predetermined voltage level and a terminal, arranged for selectively driving a signal, wherein the signal passes through the terminal;
   an N-type MOSFET (NMOSFET), coupled between the predetermined voltage level and the terminal, arranged for selectively driving the signal; and
   another NMOSFET, coupled between another predetermined voltage level and the terminal, arranged for selectively driving the signal;
   wherein the PMOSFET, the NMOSFET, and the other NMOSFET does not drive the signal at a same time.

2. The apparatus of claim 1, wherein any MOSFET within the PMOSFET, the NMOSFET, and the other NMOSFET selectively drives the signal to have one of a plurality of logical states.

3. The apparatus of claim 2, wherein the PMOSFET and the NMOSFET are arranged for selectively driving the signal to correspond to at least one logic state of the plurality of logical states; and the other NMOSFET is arranged for selectively driving the signal to correspond to another logic state of the plurality of logical states.

4. The apparatus of claim 3, wherein any two logical states within the plurality of logical states do not exist at a same time.

5. The apparatus of claim 1, wherein the PMOSFET is arranged for selectively driving the signal to have a voltage level associated to the predetermined voltage level; the NMOSFET is arranged for selectively driving the signal to have another voltage level associated to the predetermined voltage level; and the other NMOSFET is arranged for selectively driving the signal to have a voltage level associated to the other predetermined voltage level.

6. The apparatus of claim 5, wherein any two voltage levels within the voltage level associated to the predetermined voltage level, the other voltage level associated to the predetermined voltage level, and the voltage level associated to the other predetermined voltage level are different from each other.

7. The apparatus of claim 1, further comprising:
   a switching unit, coupled between the predetermined voltage level and the terminal, arranged for selectively enabling a driving path that passes through the PMOSFET, wherein the switching unit and the PMOSFET are electrically connected in series.

8. The apparatus of claim 1, further comprising:
   a switching unit, coupled between the predetermined voltage level and the terminal, arranged for selectively enabling a driving path that passes through the NMOSFET, wherein the switching unit and the NMOSFET are electrically connected in series.

9. The apparatus of claim 1, further comprising:
   a resistor, coupled between the predetermined voltage level and the terminal, wherein the resistor and the PMOSFET are electrically connected in series.

10. The apparatus of claim 1, further comprising:
    a resistor, coupled between the predetermined voltage level and the terminal, wherein the resistor and the NMOSFET are electrically connected in series.

11. The apparatus of claim 1, further comprising:
    at least one impedance component, coupled between the predetermined voltage level and the other predetermined voltage level.

12. The apparatus of claim 11, wherein the at least one impedance component comprises a capacitor.

13. The apparatus of claim 12, wherein the at least one impedance component further comprises a resistor; and the resistor and the capacitor are electrically connected in series.

14. The apparatus of claim 13, wherein the resistor is arranged for performing resonance suppression.

15. The apparatus of claim 12, further comprising:
    a switching unit, coupled between the predetermined voltage level and the terminal, arranged for selectively enabling a driving path that passes through a MOSFET within the PMOSFET and the NMOSFET, wherein the switching unit and the MOSFET are electrically connected in series, and the switching unit and the capacitor are electrically connected in series.

16. The apparatus of claim 15, wherein the switching unit is a MOSFET and is configured to play a role of a resistor, and is arranged for performing resonance suppression.

17. The apparatus of claim 12, wherein the apparatus comprises an integrated circuit (IC), and the IC comprises:
    two conductive wires, arranged for conducting the predetermined voltage level and the other predetermined voltage level, respectively, wherein the at least one impedance component is coupled between the two conductive wires; and
    an input/output (I/O) module, coupled between the two conductive wires, wherein the I/O module comprises the PMOSFET, the NMOSFET, and the other NMOSFET.

18. The apparatus of claim 1, wherein the signal is one of a set of memory input/output (I/O) signals.

19. The apparatus of claim 1, further comprising:
    a pre-driver, coupled to the PMOSFET, the NMOSFET, and the other NMOSFET, arranged for generating a plurality of control signals according to a plurality of input signals of the pre-driver, wherein the plurality of control signals comprises a gate control signal of the PMOSFET, a gate control signal of the NMOSFET, and a gate control signal of the other NMOSFET, and the gate control signals of the PMOSFET, the NMOSFET, and the other NMOSFET do not turn on the PMOSFET, the NMOSFET, and the other NMOSFET at a same time.

\* \* \* \* \*